(12) United States Patent
Matsui et al.

(10) Patent No.: US 7,435,682 B2
(45) Date of Patent: Oct. 14, 2008

(54) METHOD OF MANUFACTURING SEMICONDUCTOR DEVICE

(75) Inventors: Yukiteru Matsui, Yokohama (JP); Gaku Minamihaba, Yokohama (JP); Atsushi Shigeta, Fujisawa (JP); Hiroyuki Yano, Yokohama (JP); Satoko Seta, Inagi (JP); Hirokazu Kato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 432 days.

(21) Appl. No.: 11/118,316

(22) Filed: May 2, 2005

(65) Prior Publication Data

US 2005/0266355 A1  Dec. 1, 2005

(30) Foreign Application Priority Data

| May 31, 2004 | (JP) | ............................. 2004-162431 |
| Feb. 25, 2005 | (JP) | ............................. 2005-050603 |

(51) Int. Cl.
*H01L 21/302* (2006.01)

(52) U.S. Cl. ........................ 438/691; 438/690; 438/623; 438/634; 438/424; 438/692

(58) Field of Classification Search ................ 438/623, 438/637, 780, 690, 691; 257/E21.252
See application file for complete search history.

(56) References Cited

U.S. PATENT DOCUMENTS

| 6,051,508 | A  | * | 4/2000  | Takase et al. ................ 438/724 |
| 6,362,093 | B1 | * | 3/2002  | Jang et al. ..................... 438/633 |
| 6,365,529 | B1 | * | 4/2002  | Hussein et al. .............. 438/780 |
| 6,479,387 | B2 | * | 11/2002 | Chang ........................... 438/692 |
| 6,503,830 | B2 |   | 1/2003  | Miyata |
| 6,638,853 | B1 | * | 10/2003 | Sue et al. ...................... 438/633 |
| 6,841,480 | B2 | * | 1/2005  | Simpson et al. ............. 438/691 |
| 6,930,040 | B2 | * | 8/2005  | Hou et al. ..................... 438/657 |
| 7,049,221 | B2 | * | 5/2006  | Deguchi ....................... 438/622 |
| 7,067,419 | B2 | * | 6/2006  | Huang et al. ................. 438/638 |

(Continued)

FOREIGN PATENT DOCUMENTS

EP        1 071 121 A1     1/2001

(Continued)

OTHER PUBLICATIONS

Notification of Reasons for Rejection issued by the Japanese Patent Office on Oct. 17, 2006, for Japanese Patent Application No. 2005-050603, and English-language translation thereof.

*Primary Examiner*—Carl Whitehead, Jr.
*Assistant Examiner*—Latanya Crawford
(74) *Attorney, Agent, or Firm*—Finnegan, Henderson, Farabow, Garrett & Dunner, L.L.P.

(57) ABSTRACT

Disclosed is a method of manufacturing a semiconductor device comprising forming an insulating film above a substrate, forming a recess in the insulating film, successively forming an underlying layer, an immediate layer and a resist film above the insulating film having the recess formed thereon, the underlying layer being formed by a process comprising forming a first organic film above the insulating film, chemically mechanically polishing the first organic film to expose a surface of the insulating film and to remain the first organic film selectively in the recess, and forming a second organic film above the insulating film and above the first organic film, and subjecting the resist film to patterning exposure.

20 Claims, 7 Drawing Sheets

U.S. PATENT DOCUMENTS

| | | | |
|---|---|---|---|
| 2002/0006576 A1* | 1/2002 | Sato et al. | 430/270.1 |
| 2002/0119612 A1* | 8/2002 | Ohuchi et al | 438/200 |
| 2003/0049927 A1* | 3/2003 | Tonegawa et al. | 438/622 |
| 2003/0089990 A1* | 5/2003 | Usami | 257/758 |
| 2003/0109132 A1* | 6/2003 | Lee | 438/638 |
| 2003/0186534 A1* | 10/2003 | Nambu | 438/633 |
| 2004/0034134 A1* | 2/2004 | Lamb et al. | 524/236 |
| 2004/0198037 A1* | 10/2004 | Iba | 438/634 |
| 2004/0253822 A1* | 12/2004 | Matsui et al. | 438/690 |
| 2007/0037385 A1* | 2/2007 | Huebinger et al. | 438/638 |

FOREIGN PATENT DOCUMENTS

| | | |
|---|---|---|
| JP | 4-120719 | 4/1992 |
| JP | 07-226356 A2 | 8/1995 |
| JP | 2002-026122 A2 | 1/2002 |
| JP | 2003-209167 | 7/2003 |
| JP | 2003-297920 | 10/2003 |
| JP | 2004-152997 | 5/2004 |
| JP | 2004-296955 | 10/2004 |

* cited by examiner

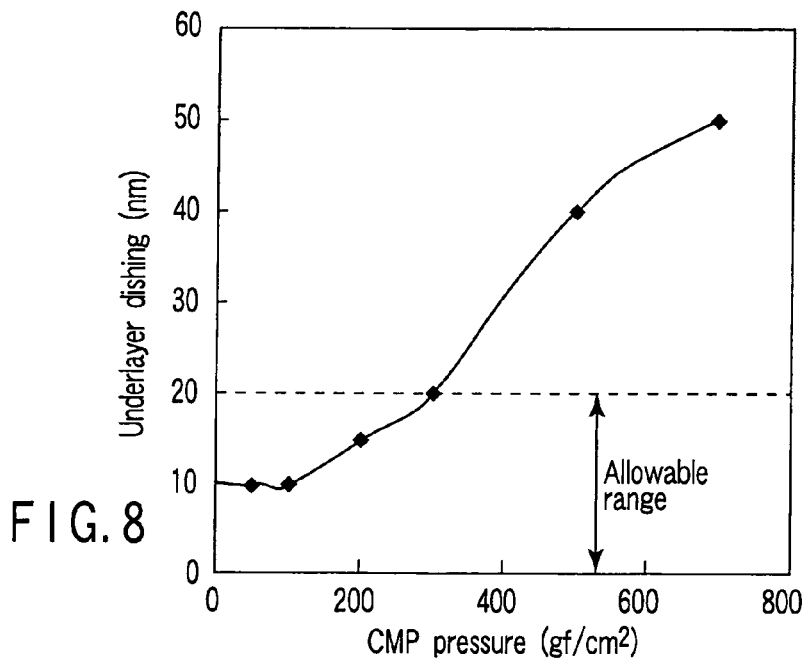
FIG. 8
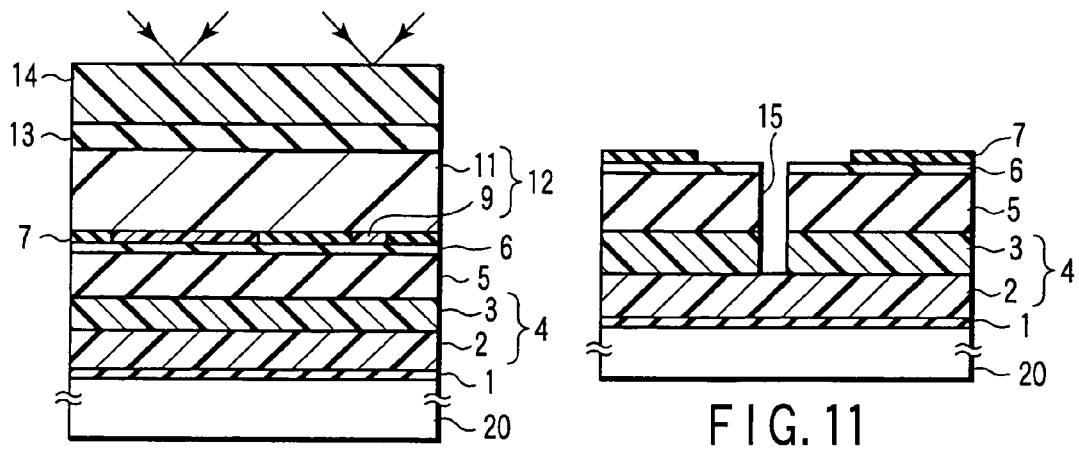
FIG. 9
FIG. 11
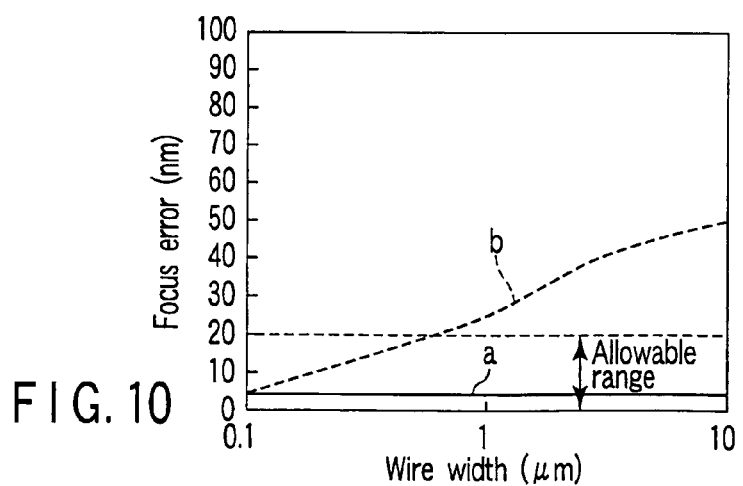
FIG. 10

METHOD OF MANUFACTURING SEMICONDUCTOR DEVICE

CROSS-REFERENCE TO RELATED APPLICATIONS

This application is based upon and claims the benefit of priority from prior Japanese Patent Applications No. 2004-162431, filed May 31, 2004; and No. 2005-050603, filed Feb. 25, 2005, the entire contents of both of which are incorporated herein by reference.

BACKGROUND OF THE INVENTION

1. Field of the Invention

This invention relates to a method of manufacturing a semiconductor device, and in particular, to a method of manufacturing a high-speed semiconductor device such as a high-speed logic LSI, a system LSI, a memory/logic hybrid LSI, etc.

2. Description of the Related Art

In recent years, there has been proposed to decrease the relative dielectric constant of an interlayer insulating film to 3.0 or less by using a monolayer or multi-layer organic film or an organic/inorganic hybrid film in an attempt to minimize the wiring resistance and inter-wiring capacity of metallic wiring in a semiconductor integrated circuit.

A dual damascene structure using a hybrid film can be fabricated by a dual hard mask method or a triple hard mask method wherein plural hard masks are employed. In these working processes, a trench pattern is formed on an upper hard mask, which is followed by a lithography process for forming a pattern of holes. On this occasion, due to step portions of the hard mask, non-uniformity in film thickness occurs in a resist film. More specifically, the thickness of the resist film formed over a wiring having a relatively large width of the order of several microns to several tens of microns would become inevitably thinner as compared with the thickness of the resist film formed over a fine wiring having a width of the order of several tens microns to several hundreds of microns.

Such a difference in film thickness of the resist film would lead to a generation of focus error at the exposure, thus generates non-uniformity of the dimension of wiring, resulting in the deterioration in yield of wiring. On the occasion of forming a pattern on an underlying layer accompanying such a step portion, a multilayer resist method is frequently employed. With a recent trend to further refine a pattern, it is imperative to further decrease the thickness of the underlying layer in order to secure the resolution of the pattern. As a result, it is very difficult to alleviate the non-uniformity in thickness of the resist film, which has been caused to occur due to the step portion of the hard mask.

With regard to the process of forming wiring trenches and interconnecting holes by using plural layers of hard masks, there has been proposed a method wherein an underlying layer is deposited immediately above a second mask layer having a pattern of wiring trenches formed thereon, and then the surface of this underlying layer is planarized. In this case, this underlying layer is formed of a silicon oxide film, and the base layer on which this underlying layer is deposited is also constituted by a silicon oxide film. Therefore, it is possible to remove this underlying layer when etching the silicon oxide film constituting the base layer without necessitating a separate process which is exclusively assigned for the removal of this underlying layer. However, in order to protect the second mask layer existing immediately below this underlying layer, this underlying layer is required to be formed so as to sufficiently cover this second mask layer. When these circumstances are taken into account, this underlying layer is required to have more or less a sufficient degree of thickness, thus limiting the thinning of this underlying layer.

BRIEF SUMMARY OF THE INVENTION

A method of manufacturing a semiconductor device according to one aspect of the present invention comprises forming an insulating film above a substrate; forming a recess in the insulating film; successively forming an underlying layer, an immediate layer and a resist film above the insulating film having the recess formed thereon, the underlying layer being formed by a process comprising: forming a first organic film above the insulating film; chemically mechanically polishing the first organic film to expose a surface of the insulating film and to remain the first organic film selectively in the recess; and forming a second organic film above the insulating film and above the first organic film; and subjecting the resist film to patterning exposure.

A method of manufacturing a semiconductor device according to another aspect of the present invention comprises forming an organic insulating film containing an organic material above a substrate; forming a first hard mask, a second hard mask and a third hard mask each containing an inorganic material above the organic insulating film; forming a recess in the third hard mask; successively forming an underlying layer, an immediate layer and a resist film above the third hard mask having the recess formed thereon, the underlying layer being formed by a process comprising: forming a first organic film above the third hard mask; chemically mechanically polishing the first organic film to expose a surface of the third hard mask and to remain the first organic film selectively in the recess; and forming a second organic film above the third hard mask and above the first organic film; and subjecting the resist film to patterning exposure.

A method of manufacturing a semiconductor device according to another aspect of the present invention comprises forming an organic insulating film containing an organic material above a substrate; forming a first hard mask and a second hard mask each containing an inorganic material above the organic insulating film; forming a recess in the second hard mask; successively forming an underlying layer, an immediate layer and a resist film above the second hard mask having the recess formed thereon, the underlying layer being formed by a process comprising: forming a first organic film above the second hard mask; chemically mechanically polishing the first organic film to expose a surface of the second hard mask and to remain the first organic film selectively in the recess; and forming a second organic film above the second hard mask and above the first organic film; and subjecting the resist film to patterning exposure.

BRIEF DESCRIPTION OF THE SEVERAL VIEWS OF THE DRAWING

FIG. 8 is a graph illustrating the relationship between the load of CMP and the magnitude of dishing;

FIG. 9 is a cross-sectional view illustrating a step following the step illustrated in FIG. 3;

FIG. 10 is a graph illustrating the relationship between the width of wiring and the focus error;

FIG. 11 is a cross-sectional view illustrating a step following the step illustrated in FIG. 9;

DETAILED DESCRIPTION OF THE INVENTION

Various embodiments of the present invention will be explained with reference to drawings as follows.

Embodiment 1

The method involved in this embodiment will be explained with reference to FIGS. 1 to 15. The method employed in this embodiment is a hybrid dual damascene working method using a triple hard mask method wherein the CMP of an organic film is involved. Incidentally, by the term "hybrid" employed herein, means that wiring trench is constituted not only by an organic insulating film but also by an inorganic insulating film.

Figure 1:
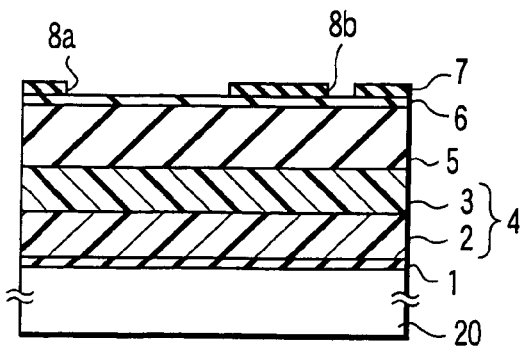
FIG. 1 is a cross-sectional view illustrating the method of manufacturing a semiconductor device according to one embodiment of the present invention.

First of all, as shown in FIG. 1, an organic insulating film 4, a first hard mask 5 containing an inorganic material, a second hard mask 6 containing an inorganic material, and a third hard mask 7 containing an inorganic material were successively formed on a semiconductor substrate 20 provided with semiconductor elements (not shown). Thereafter, patterns of wiring trenches 8a and 8b as recesses were formed in the third hard mask 7. In this embodiment, the organic insulating film 4 was formed of a 2-ply structure comprising a first organic insulating film 2 and a second organic insulating film 3, and an etching stopper film 1 having a thickness of 35 nm was formed on the underside of the organic insulating film 4.

Although not shown in FIG. 1, an interlayer insulating film having a first wiring layer buried therein was interposed between the etching stopper film 1 and the semiconductor substrate 20. As for the interlayer insulating film, it is possible to employ a silicon oxide film for instance, and the first wiring layer can be formed by burying Cu through a barrier layer in the interlayer insulating film. The etching stopper film 1 acts also as a stopper for preventing the diffusion of this Cu, and can be formed through the deposition of SiN film for instance.

The first organic insulating film 2 and the second organic insulating film 3 were formed through the deposition of SiOC and PAE (polyaryl ether), respectively, by a PE-CVD (Plasma Enhancement Chemical Vapor Deposition) method. As for specific examples of the organic film, it is possible to employ polyaryl ether ("FLARE" (trademark), Allied Signal Co., Ltd.; or "SiLK" (trademark), Dow Chemical Co., Ltd.), benzocyclobutene (Dow Chemical Co., Ltd.), polyimide, etc. As for the thickness of these first and second organic insulating films 2 and 3, although there is no particular limitation, it may be selected from within the range of 50 to 400 nm.

Incidentally, as for the materials for the organic film that can be formed by a CVD method, Coral (trademark, Novelas Co., Ltd.), Aurora (trademark, ASM Co., Ltd.), and Black Diamond (trademark, Applied Material Co., Ltd.), etc. are known useful. As for the materials for the organic film that can be formed coating method, methylsilsesquioxane, etc. are useful.

By a CVD method or PVD (Physical Vapor Deposition) method, a silane type $SiO_2$ film was formed as the first hard mask 5 on the organic insulating film 4 which was constituted by these first and second organic insulating films 2 and 3. As for the second hard mask 6, it is possible to employ an SiN film for instance. As for the third hard mask 7, it is possible to employ a TEOS (tetraethoxy silane) for instance. Alternatively, these first, second and third hard masks 5, 6 and 7 may be formed by using any of these materials. Further, these hard masks can be formed using a silicon carbide film. In this embodiment, the film thickness of each of these first, second and third hard masks 5, 6 and 7 was set to 145 nm, 50 nm and 50 nm, respectively.

A resist pattern (not shown) was formed on the third hard mask 7, and then the third hard mask 7 was subjected to dry etching by using a gas comprising $C_4F_8/CO/Ar$ to form pattern of wiring trenches 8a and 8b as recesses as shown in FIG. 1. The width of each of these wiring trenches 8a and 8b was 3 μm and 0.4 μm, respectively.

Figure 2:
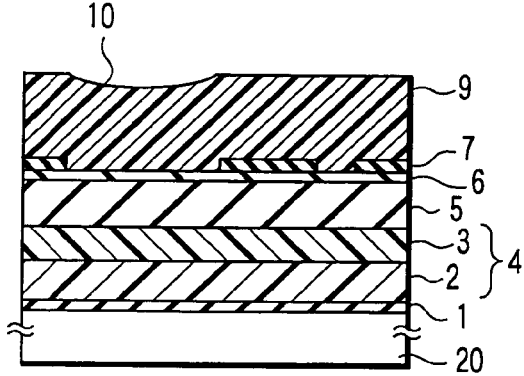
FIG. 2 is a cross-sectional view illustrating a step following the step illustrated in FIG. 1.

On the third hard mask 7 provided with these wiring trenches 8a and 8b, there was formed a first organic film 9 as shown in FIG. 2. This first organic film 9 contacts, at the bottom thereof, with the second hard mask 6 formed of SiN. This first organic film 9 was formed in such a manner that a resist (IX370G available from JSR Co., Ltd.) mainly comprising novolak resin was coated over the third hard mask 7 to form a coated film having a thickness of 0.3 μm, which was then subjected to prebaking for 60 seconds at a temperature of 180° C. and then to post-baking for 60 seconds at a temperature of 300° C. to obtain a first organic film 9. When the baking is performed at a high temperature of 300° C. or more, the first organic film 9 to be obtained is more or less hardened, making it advantageous in planarizing the resultant surface. On the other hand, when the baking is performed at a low temperature of less than 300° C., the resultant surface would become too soft so that it may become difficult to sufficiently suppress the generation of dishing.

As shown in FIG. 2, the surface of the first organic film 9 was accompanied with a step portion 10 which reflecting the pattern of the wiring trench Ba, the depth of this step portion 10 being about 35 nm. In this embodiment, this step portion 10 was planarized by CMP, which was followed by the re-deposition of the organic film to form an underlying layer, thus suppressing the focus error. The employment of an organic film mainly comprising novolak resin is advantageous in the respect that it can be more easily planarized as compared with an organic film mainly comprising cyclohexanone for instance. Moreover, the organic film mainly comprising novolak resin is higher in adhesive strength to the third hard mask 7 as compared with the organic film mainly comprising cyclohexanone, so that the peeling thereof during the step of CMP can be minimized as compared with the organic film mainly comprising cyclohexanone.

By using EPO-222 (a CMP apparatus, available from EBARA CORPORATION Ltd.), the polishing of the first organic film 9 was performed. Namely, while rotating a turntable having a polishing pad attached thereto at a speed of 100 rpm, a top ring holding a semiconductor wafer was allowed to contact with the polishing pad at a polishing load of 100 $gf/cm^2$. As for the polishing pad, IC1000/Suba4000 (trademark; RODEL NITTA Co., Ltd.) was employed, and the rotational speed of the top ring was set to 101 rpm. The polishing was performed for 60 seconds while feeding a slurry over the polishing pad at a flow rate of 200 cc/min. The slurry was prepared by dispersing γ-alumina (primary particle having a particle diameter of about 30 nm) as abrasive particles in pure water at a concentration of 1 wt %.

Figure 3:
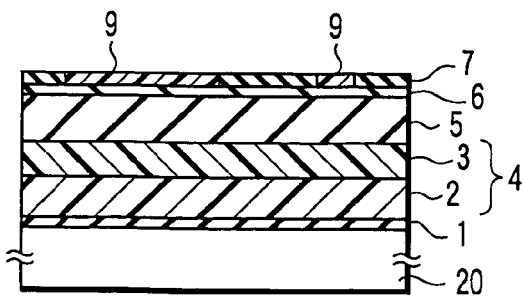
FIG. 3 is a cross-sectional view illustrating a step following the step illustrated in FIG. 2.

As a result, as shown in FIG. 3, the surface of the third hard mask 7 was exposed, and the first organic film 9 was selectively buried in the pattern of wiring trenches 8a and 8b. Further, it was possible to restrict the dishing on the surface of the first organic film 9 to not more than 10 nm in depth after the aforementioned polishing.

Figure 4:
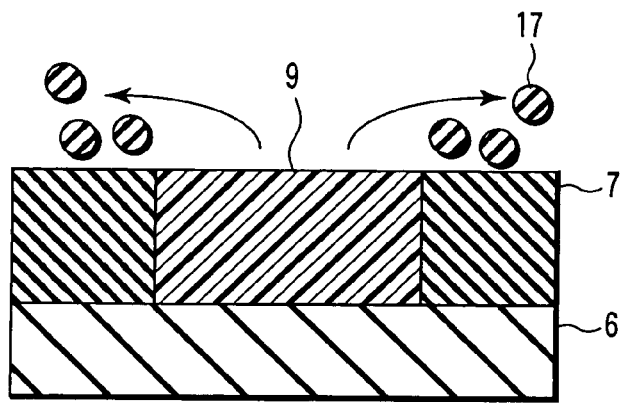
FIG. 4 is a schematic view illustrating a state of hydrophilic particles on a first organic film.

As for the abrasive particles to be employed for polishing the first organic film 9, it is preferable to employ abrasive particles having a hydrophilized surface. Since the first organic film 9 to be polished is hydrophobic, hydrophilic abrasive particles are capable of repelling the organic film in a suitable manner. Namely, as shown in FIG. 4, the abrasive particles 17 having a hydrophilized surface do not remain on the first organic film 9, thereby suppressing the generation of dishing.

Figure 5:
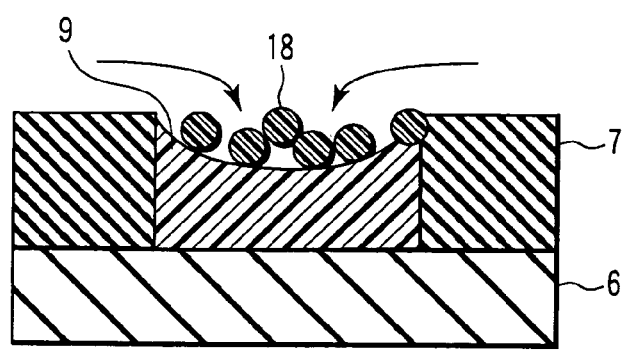
FIG. 5 is a schematic view illustrating a state of hydrophobic particles on a first organic film.

Whereas, if hydrophobic particles are employed as the abrasive particles, the interaction between the first organic film 9 and the hydrophobic particles would becomes too strong. As a result, as shown in FIG. 5, the hydrophobic abrasive particles 18 remain inside the trenches of the first organic film 9, thereby promoting dishing.

The surface of the organic particle can be hydrophilized by the attachment of a functional group to the organic particle through the addition of a surfactant, for example. Furthermore, particles such as silica, alumina, etc. inherently have a hydrophilic surface. Therefore, these particles can be used as they are, without necessitating any particular hydrophilization treatment. Incidentally, examples of hydrophobic abrasive particles include PMMA particles, polystyrene particles, etc.

In order to suitably polish the first organic film 9 that has been hardened by high-temperature baking, it is preferable to employ abrasive particles which is more or less high in hardness, one suitable example of such abrasive particles being γ-alumina. When polystyrene particles or colloidal silica was employed as abrasive particles and the polishing of the first organic film 9 was performed under the same conditions as described above, the first organic film 9 remained over the entire surface, thus failing to satisfactorily perform the polishing. The reason for this can be attributed to the fact that these abrasive particles were not hard enough to satisfactorily polish the first organic film 9 that had been baked at a high temperature.

Even when γ-alumina is employed as abrasive particles, the first organic film 9 should preferably be formed, as a main component, of novolak resin that has been baked at a high temperature. Even if the same kind of novolak resin as described above is employed, it would be difficult to polish the organic film to obtain a planarized surface if this organic film is one which has been baked at a low temperature. For example, when an organic film comprising a novolak resin was formed by baking it for 60 seconds at a temperature of 90° C. and the polishing thereof was performed under the same conditions as described above, part of the film remained unpolished. On the other hand, even in a case where an organic film was formed using cyclohexanone-based resin and subjected to baking for 120 seconds at a temperature of 130° C. prior to the polishing thereof, part of the film remained unpolished.

As described above, in order to retain the planarity after the CMP of the first organic film, it is desirable that the first organic film is more or less high in hardness. If the hardness of the first organic film is insufficient and fragile, the speed of removing the organic film inside the trench by alumina particles would become so fast that it would be impossible to suppress the generation of dishing. The hardness of the organic film can be controlled through the adjustment of the baking temperature thereof, the relationship between the hardness of the organic film and the baking temperature being illustrated in the graph of FIG. 6. In this graph, the average hardness (Ave.) and variability (Max-Min) of the organic film are shown.

Herein, the organic film was formed by using novolac resin and the hardness thereof was measured using a hardness-measuring equipment (NANOINDENTER (trade mark), KOBERCO Co., Ltd.). More specifically, the average hardness (Ave.) was determined by measuring the hardness at 15 points within a region of 1 cm². The variability (Max-Min) of the organic film represents a difference between a maximum value (Max) and a minimum value (Min).

Figure 6:
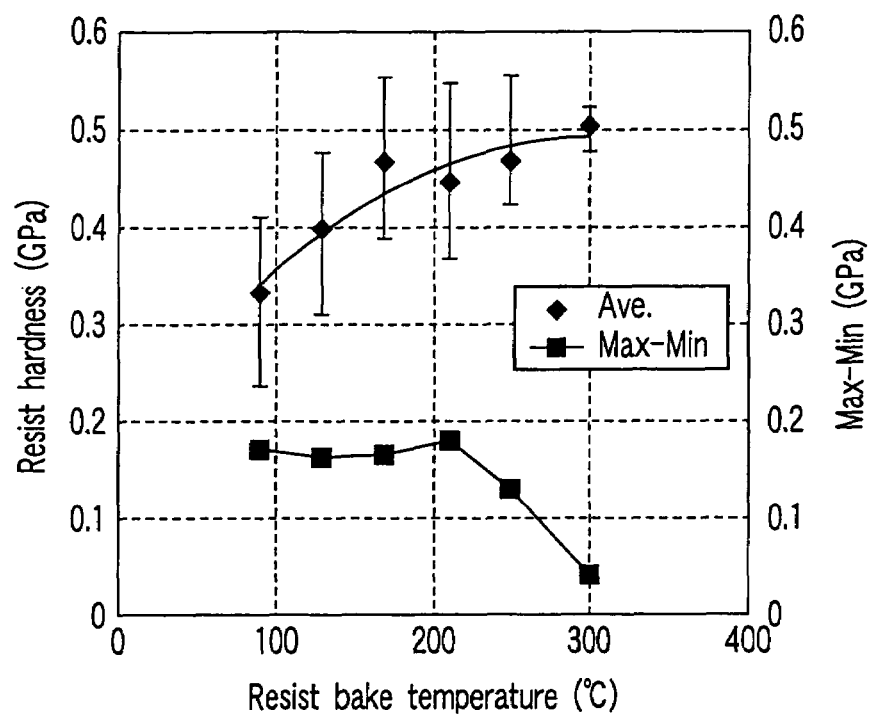
FIG. 6 is a graph illustrating the relationship between a baking temperature of the resist film and hardness of the resist film.

An organic film is generally featured in that when the baking temperature of the organic film is raised, the crosslinking of polymer constituting the organic film initiates and when the baking temperature is raised higher than the crosslinking-finishing temperature, the crosslinking of the polymer is completed, thus obtaining a film which is very high in hardness. In the case of the novolac resin employed herein, the crosslinking thereof initiates at a temperature of around 150° C. and finishes at a temperature of around 280° C. As shown in the graph of FIG. 6, when the baking temperature of the polymer is set to 300° C., the average hardness of the organic film to be obtained would be about 0.5 GPa and the variability in hardness of the organic film would be as small as 0.1 GPa or less. Since the organic film thus obtained is sufficiently high and uniform in hardness, the employment of such an organic film is advantageous in obtaining a planarized surface. Reasons for this will be explained below with reference to FIG. 7.

Figure 7:
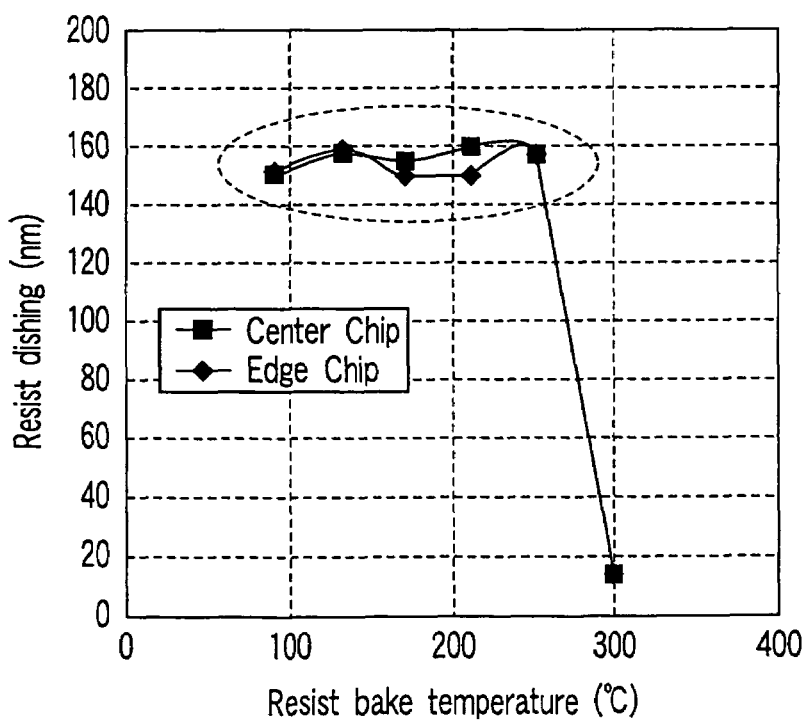
FIG. 7 is a graph illustrating the relationship between a baking temperature of the resist film and dishing generated on the surface of the resist film.

The graph of FIG. 7 illustrates the relationship between the baking temperature and the magnitude of dishing. In order to obtain an organic film, novolac resin was coated on the wafer and baked at a predetermined temperature. Then, under the same conditions as described above, the resultant organic film was subjected to CMP and the depth of dishing was measured at a central portion of the wafer as well as at edge portions of the wafer.

In the cases where the baking temperature of the organic film was lower than the crosslinking-finishing temperature of the novolac resin, the depth of the dishing was increased to as large as about 150 nm. Whereas, when the baking of the organic film was performed at a temperature higher than the crosslinking-finishing temperature of the novolac resin, e.g. about 300° C. for instance, the depth of the dishing was decreased to 20 nm or less as shown in FIG. 7. If the depth of dishing can be confined within about 20 nm, it is generally considered acceptable. As described above, it will be recognized that, when an organic film is sufficiently cured prior to CMP, the CMP can be performed without permitting alumina particles to enter into the trench. Incidentally, in order to prevent the decomposition of the resin employed as a material for organic film, the baking temperature should preferably be limited to 350° C. or so at most.

It will be recognized from FIGS. 6 and 7 that when the average hardness of the organic film is 0.45 GPa or less, the organic film is insufficient in hardness and hence it is difficult to suppress the development of dishing. Further, if the variability in hardness of the organic film is as large as 0.1 GPa or more, a region which is insufficient in hardness would be invaded by alumina particles, thereby making it difficult to secure the planarity of the organic film. Therefore, the baking temperature of the organic film should desirably be higher than the crosslinking-finishing temperature. In order to minimize the dishing and to secure the planarity after the CMP of the organic film, the average hardness of the organic film to be obtained should preferably be larger than 0.45 GPa and the variability in hardness of the organic film should preferably be less than 0.1 GPa. Incidentally, if the average hardness of the organic film is too large, the organic film may become fragile, resulting in the degrading in the adhesion thereof to a hard mask, thus the organic film is easily peeled off. Additionally, the polishing speed of the organic film would be lowered, thus productivity would be degrade. In order to obviate these problems, it is preferable to confine the upper limit of the average hardness of the organic film to 0.6 GPa or so.

The graph of FIG. 8 illustrates the relationship between the load of CMP and the magnitude of dishing in the first organic film 9. If the magnitude of dishing is confined within the range of not more than 20 nm, it may an allowable range which does not undesirably influence the product. Therefore, it is preferable that the first organic film 9 is polished under a low load of not more than 300 gf/cm². If the pressure is too low, it may be impossible to sufficiently execute the polishing, so that the lower limit of the load would be about 50 gf/cm² in general.

Further, the IX370G was again coated to form a second organic film 11 to obtain an underlying layer 12 comprising the first organic film 9 and the second organic film 11. Thereafter, as shown in FIG. 9, an SOG (Spin On Glass) film as an intermediate layer 13 and a resist film 14 were successively formed. In this embodiment, the second organic film 11 was deposited to a thickness of 300 nm. On the other hand, the thickness of each of the intermediate layer 13 and the resist film 14 was set to 45 nm and 200 nm, respectively.

Subsequently, through an exposure mask having a pattern of holes each having a diameter of 140 nm, the resist film 14 was subjected to the exposure using a KrF excimer laser. On this occasion, due to the planarization by the CMP, the focus error in the formation of via-holes on the wirings having a width of 3 μm or 0.4 μm was limited to 10 nm or less. The graph of FIG. 10 illustrates the relationship between the width of wiring and the focus error. The results obtained in this embodiment are illustrated by a solid line "a" indicating that the focus error was substantially constant irrespective of the width of wiring. It will be seen from these results that the non-uniformity in dimension of pattern can be suppressed and hence the yield of product can be remarkably enhanced. Incidentally, the dashed line "b" in FIG. 10 illustrates a case where the exposure was performed on a resist film which was formed according to the conventional method, which will be explained hereinafter.

For reference, the CMP of the first organic film 9 was performed without using the third hard mask 7 as a stopper, and the polishing of the first organic film 9 was suspended during polishing. In this case, it was impossible to secure the planarity, thus generating step portions on the surface of the first organic film 9, the highest step portion being as large as 50 nm. Even if the second organic film 11 is deposited on such a first organic film 9 to form the underlying layer, it would be impossible to minimize the focus error.

After finishing the exposure, the resist film 14 was developed by using a developing solution to obtain a resist pattern (not shown), which was then used as an etching mask to work the intermediate layer 13 by using $CHF_3/O_2$ gas. Further, by using $NH_3/O_2/CH_4$ gas, the underlying layer 12 was worked, and the resist pattern was removed by $O_2$ ashing.

By using the patterned intermediate layer 13 and the underlying layer 12 as a mask, an interconnecting hole was formed so as to pierce through the second hard mask 6 and the first hard mask 5 by dry etching. As for the etching gas, a gas comprising $CHF_3/Ar/O_2$ was employed. Incidentally, when working the first hard mask 5, the intermediate layer was removed. Thereafter, dry etching was performed using $NH_3$ gas to form an interconnecting hole 15 in the second organic insulating film 3 as shown in FIG. 11. Incidentally, the underlying layer 12 was removed when working the second organic insulating film 3.

Figure 12:
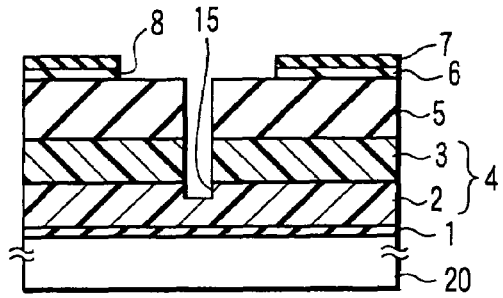
FIG. 12 is a cross-sectional view illustrating a step following the step illustrated in FIG. 11.
Figure 13:
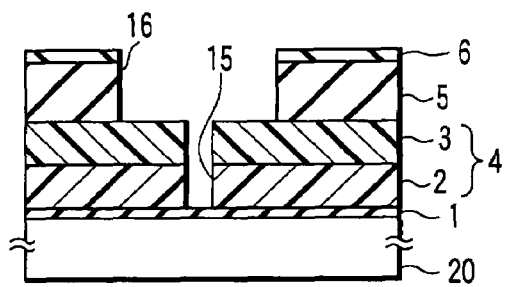
FIG. 13 is a cross-sectional view illustrating a step following the step illustrated in FIG. 12.

Then, by using a gas comprising $CH_2F_2/CF_4/Ar/O_2$, dry etching was performed to form a pattern of wiring trench 8 in the second hard mask 6 as shown in FIG. 12. As shown in FIG. 12, the interconnecting hole 15 on this case was permitted to proceed down to a middle of the first organic insulating film 2. Further, by using a gas comprising $C_5F_8/Ar/O_2$, the third hard mask 7 was removed and at the same time, a wiring trench 16 was formed in the first hard mask 5 as shown in FIG. 13. In this case, the interconnecting hole 15 was formed to reach the etching stopper film 1. As described above, by a two-stage working process, the interconnecting hole 15 was formed in the first organic insulating film 2. This method is advantageous in the respect that the interconnecting hole 15 can be formed so as to reliably pierce through the first organic insulating film 2.

Figure 15:
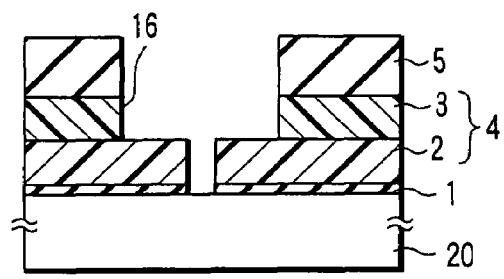
FIG. 15 is a cross-sectional view illustrating a step following the step illustrated in FIG. 14.
Figure 14:
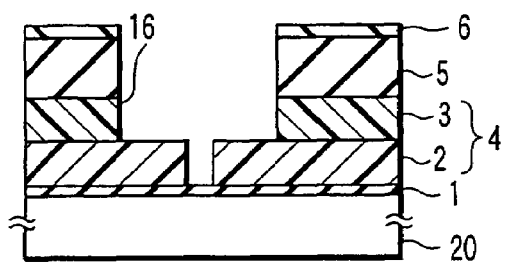
FIG. 14 is a cross-sectional view illustrating a step following the step illustrated in FIG. 13.

Then, by dry etching using $NH_3$ gas, a wiring trench 16 was formed in the second organic insulating film 3 as shown in FIG. 14. Finally, by using a gas comprising $CH_2F_2/CF_4/Ar/O_2$, the second hard mask 6 was removed as shown in FIG. 15. On this occasion, the etching stopper film 1 existing on the bottom of the interconnecting hole 15 was also removed.

Subsequently, a barrier layer (not shown) was formed on the inner wall of the recesses such as the interconnecting hole 15 and the wiring trench 16. Then, these recesses were filled with a Cu film, and redundant portions of the Cu film and of the barrier layer existing on the silicon oxide film employed as the first hard mask 5 were removed. As a result, it was possible to form a Cu damascene wiring in these recesses, thus forming a hybrid dual damascene wiring.

In this embodiment, the first organic film 9 was planarized by CMP prior to the formation of a multi-layer by additionally depositing a resist film above the first organic film 9. Accordingly, it was possible to limit the focus error to 10 nm or less during the step of exposure, thereby suppressing the non-uniformity in dimension of pattern and hence remarkably enhancing the yield of product.

Figure 16:
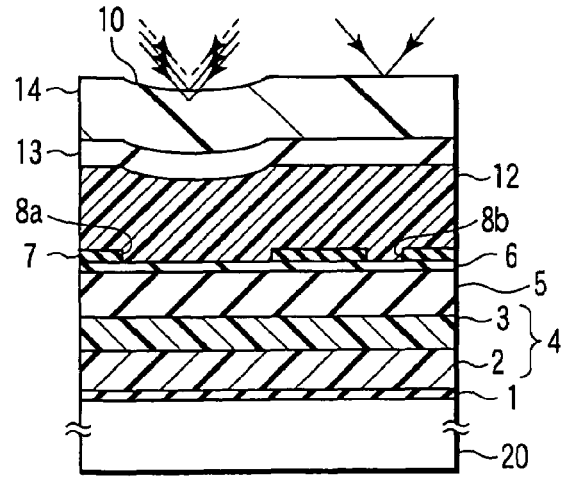
FIG. 16 is a cross-sectional view illustrating the method of manufacturing a semiconductor device according to the conventional method.

For the purpose of comparison, a hybrid dual damascene wiring was tried to form the conventional method. First of all, after finishing the formation of the structure shown in FIG. 1 by the same method as described above, the underlying layer 12, the intermediate layer 13 formed of SOG, and the resist film 14 were successively formed on the third hard mask 7 as shown in FIG. 16. In the same manner as described above, the third hard mask 7 was provided with a pattern of wiring trenches 8a having a width of 3 µm and with a pattern of wiring trenches 8b having a width of 0.4 µm. In this case, the underlying layer 12 was the first organic film 9 itself which was deposited on the third hard mask 7, and hence the underlying layer 12 was formed without being subjected to planarizing process. In order to enhance the resolution, the film thickness of the underlying layer 12 was set to 300 nm. If the underlying layer 12 is formed thinner as described above, it would be impossible to alleviate the magnitude of the step portion of the hard mask.

As shown in FIG. 16, the film thickness of the underlying layer 12 existing over the pattern of wiring trenches 8a having a width of 3 µm was smaller than that of the underlying layer 12 existing over the pattern of wiring trenches 8b having a width of 0.4 µm, the difference in film thickness between them being about 40 nm. This magnitude of difference in film thickness would inevitably lead to a generation of focus error, thus resulting in an increase of non-uniformity in pattern dimension and hence the deterioration of the yield of product.

Subsequently, by using a predetermined exposure mask, the exposure of the resist film 14 was performed by KrF excimer laser. The relationship between the width of wiring and the focus error on this occasion is shown as a dashed line "b" in FIG. 10. The focus error between the wiring having a width of 3 µm and the wiring having a width of 0.4 µm was as large as 40 nm.

Embodiment 2

This embodiment illustrates a case where a pattern of holes was formed lithography using an ArF excimer laser, which was capable of forming a finer pattern.

In the process using a multi-layer resist, the underlying layer is also capable of functioning as an anti-reflection layer. From this viewpoint, if the lithography is to be performed by using an ArF excimer laser, it is required to employ an organic film containing cyclohexanone as a main component.

As already explained, cyclohexanone is poor in adhesive strength to a hard mask and hence accompanied with the drawback that the planarizing thereof is difficult. Therefore, in this embodiment, a first organic film 9 mainly comprising novolak resin was formed at first subsequent to the step of working of the third hard mask, which was followed by the planarizing of the first organic film 9. Subsequently, a second organic film 11 mainly comprising cyclohexanone was formed to obtain an underlying layer 12, on which an intermediate layer 13 comprising SOG was coated. Thereafter, a resist film 14 was deposited on the intermediate layer 13 and then subjected to lithography using an ArF excimer laser to form a pattern of holes.

More specifically, it was attempted to form a hybrid dual damascene wiring by following the same procedure as explained in Embodiment 1 except that a resist mainly comprising cyclohexanone (CT01, JSR Co., Ltd.) was employed as the second organic film. In the step of patterning exposure, a mask having a pattern of holes each having a diameter of 100 nm was employed.

In this case also, due to the planarizing by CMP, the focus error in the formation of via-holes on the wirings having a width of 3 µm or 0.4 µm was limited to 10 nm or less. In the same manner as in the case of the aforementioned Embodiment 1, the results obtained in this embodiment are illustrated by a solid line "a" in FIG. 10 indicating that the focus error was substantially constant irrespective of the width of wiring. As a result, it was possible to suppress non-uniformities in pattern dimension and hence to remarkably enhance the product yield.

Further, a pattern of holes was formed in the same manner as described above except that the width in the pattern of the wiring trenches was altered to 5.0 µm from 3.0 µm. Then, the dimension of via-holes over these wirings was measured by using SEM. In this case, the target via-hole diameter was set to 100 nm, and ED Tree analysis was performed with the range of allowance being set to ±10% of this set value, thereby calculating, through simulation, margin curves for the wirings of 0.4 µm and 5.0 µm.

Figures 17A, 17B:
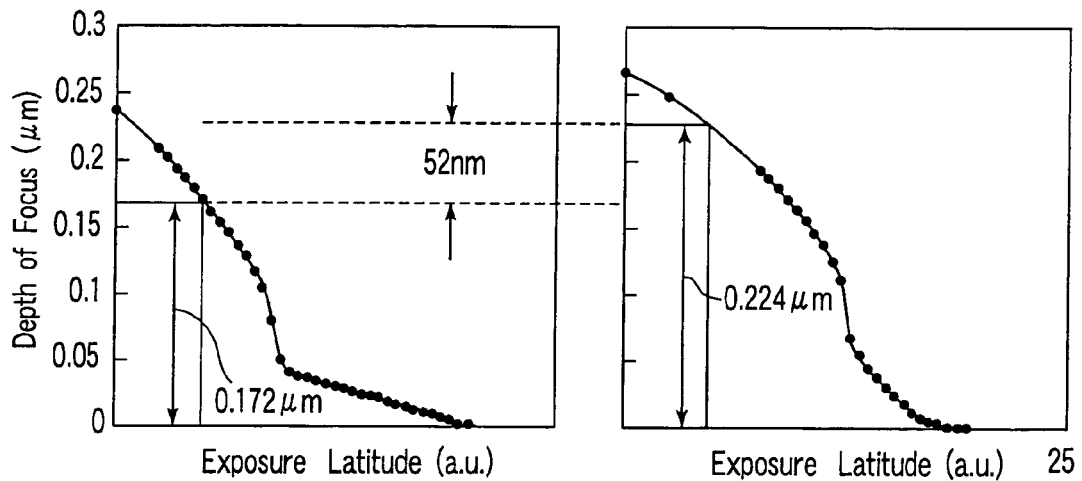
FIGS. 17A and 17B are graphs illustrating a common margin curve of via-holes on a wiring of 0.4 μm and of 5 μm, respectively.

The results obtained are illustrated in the graph of FIG. 17B. Incidentally, FIG. 17A shows the results of simulation obtained when the pattern of holes was formed according to the conventional method. Since the first organic film was not planarized, the film thickness of the underlying layer 12 existing over the pattern of wiring trenches 8a was smaller than that of the underlying layer 12 existing over the pattern of wiring trenches 8b as shown in FIG. 16, the difference in film thickness between them being about 50 nm which corresponded to the film thickness of the third hard mask 7. This difference in film thickness would give rise to the focus error. When the graph of FIG. 17A is compared with the graph of FIG. 17B, it will be clear that while the depth of focus according to the conventional method (FIG. 17A) was 0.172 µm, the depth of focus according to this embodiment (FIG. 17B) was increased to 0.224 μm. As explained above, it was confirmed possible to decrease the focus error by planarizing the first organic film.

Embodiment 3

In this embodiment, in order to enhance the adhesive strength between the underlying layer and the hard mask, the film thickness of the third hard mask 7 was increased.

According to the ordinary triple hard mask method, in viewpoint of securing the depth of focus of lithography, the film thickness of the third hard mask (TEOS) is set to about 50 nm.

In this case however, the depth of the trenches in the hard mask would become shallow and hence the mechanical strength between the underlying layer and the hard mask would be poor. In this case, the first organic film is no longer capable of withstanding the stress of CMP, so that the peeling of the first organic film may generate in the trenches.

In this embodiment, the procedures of Embodiment 1 were repeated in the same manner except that the film thickness of the third hard mask (TEOS) was increased to 150 nm. In this case, since the depth of the trenches was increased, the mechanical bonding strength between the first organic film 9 and the third hard mask 7 could be increased. Due to this anchoring effect, it was possible to prominently minimize the peeling of the first organic film 9 inside the trenches during the step of CMP. More specifically, the ratio of peeling of the first organic film 9 was confined to 5% or less in the area of 10 μm-80% pattern. Incidentally, when the film thickness of the third hard mask 7 was set to 50 nm or less as in the case of the prior art, the peeling of the first organic film 9 generated in an area of not less than 80% in the area of 10 μm-80% pattern.

When the film thickness of the third hard mask 7 is increased, the magnitude of the initial step portion immediately after the coating of the first organic film 9 may be increased to about 100 nm. However, since the first organic film 9 is subjected to CMP, the planarity after the CMP can be controlled to 15 nm or less.

The film thickness of the third hard mask 7 may be selected from the range of 50 nm to 200 nm, preferably 70 nm to 200 nm, more preferably 100 nm to 150 nm. If the film thickness of the third hard mask 7 is less than 50 nm, it may become difficult to suppress the peeling of the hard mask. On the other hand, if the film thickness of the third hard mask 7 exceeds 200 nm, it may become difficult to planarize the first organic film 9, thus giving rise to difficulties in smoothly performing the subsequent working processes.

Embodiment 4

In this embodiment, in order to prevent the peeling of the underlying layer inside the trenches, the film thickness of the first organic film 9 was decreased.

The peeling of the organic film 9 inside the trenches, i.e. inside the pattern of trenches 8a and 8b formed in the third hard mask 7 may be promoted especially during the step of over-polishing to be performed subsequent to the removal of the organic film existed over the field region. In this embodiment, in order to alleviate the over-polishing that may be caused due to the irregularity of polishing rate within a wafer, the film thickness of the first organic film 9 was decreased.

For instance, it was confirmed that in a case where an organic film was deposited to a thickness of 300 nm relative to the depth of trench which was set to 50 nm, a polishing period of about 30 seconds would be the just polishing, and that if over-polishing for a period of 15 seconds was performed, the peeling of the organic film was promoted.

The procedures of Embodiment 1 were repeated in the same manner except that the film thickness of the first organic film 9 was decreased to 150 nm. In this case, the just polishing was attained by a polishing period of 15 seconds. Even if over-polishing was continued for a period of 15 seconds, the enlargement of the peeling of the organic film was not recognized. More specifically, the ratio of peeling of the organic film was confined to 10% or less in the area of 10 μm-80% pattern.

The thickness of the first organic film 9 should preferably be confined within the range of (50 nm+the depth of trench) to (100 nm+the depth of trench). If the thickness of the first organic film 9 is less than a total of 50 nm+the depth of trench, the polishing margin of CMP would become too small, thus making it difficult to planarize the surface of the organic film. On the other hand, if the thickness of the first organic film 9 exceeds a total of 100 nm+the depth of trench, the peeling due to over-polishing may become more prominent.

Embodiment 5

In this embodiment, in order to enhance the adhesive strength between the underlying layer and the hard mask, the first organic film 9 was subjected to an electron beam curing treatment subsequent to the coating of the first organic film 9.

Even if the first organic film 9 is subjected to an ordinary thermal cure, the adhesive strength between the first organic film 9 and the third hard mask 7 may not be sufficiently increased. In such a case, the peeling of the organic film generates prominently inside the trenches during the step of CMP. In this embodiment, the procedures of Embodiment 1 were repeated in the same manner except that the first organic film 9 was subjected to an electron beam curing treatment subsequent to the coating of the first organic film 9. As a result, it was possible to prominently enhance the adhesive strength between the first organic film 9 and the third hard mask 7 and hence to minimize the peeling of the organic film inside the trenches in the subsequent step of CMP. More specifically, the ratio of peeling of the organic film was confined to 30% or less in the area of 10 μm-80% pattern.

By using ECTUS SOD (Tokyo Electron Co., Ltd.) as EB cure apparatus, the curing of the first organic film 9 was performed under the conditions of: 13 keV in accelerated voltage/3 μm in Ar flow rate/10 Torr in pressure/300° C. in wafer temperature/4 minutes. It is possible to enhance the adhesive strength between the first organic film 9 and the third hard mask 7 by using a method such as UV-curing.

In the Embodiments 3 to 5, methods for suppressing the peeling of the first organic film through the enhancement of the adhesive strength of the first organic film have been explained. It is also possible to optionally combine the conditions and the procedures illustrated in these embodiments so as to minimize the focus error while enhancing the adhesion between the first organic film and the hard mask.

Embodiment 6

The method involved in this embodiment will be explained with reference to FIGS. 18 to 26. The method employed in this embodiment was a hybrid dual damascene working method using a dual hard mask method wherein the CMP of an organic film was involved.

Figure 18:
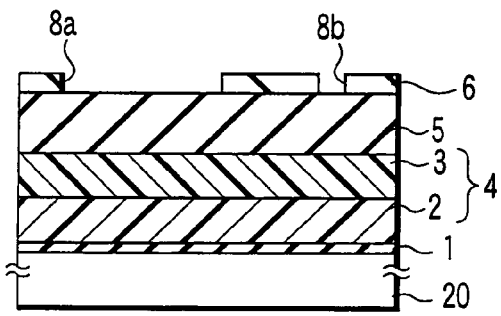
FIG. 18 is a cross-sectional view illustrating the method of manufacturing a semiconductor device according to another embodiment of the present invention.

First of all, as shown in FIG. 18, an organic insulating film 4, a first hard mask 5 containing an inorganic material, and a second hard mask 6 containing an inorganic material were successively formed on a semiconductor substrate 20 provided with semiconductor elements (not shown). Thereafter, patterns of wiring trenches 8a and 8b as recesses were formed in the second hard mask 6. In this embodiment, the organic insulating film 4 was formed of a 2-ply structure constituted by a first organic insulating film 2 and a second organic insulating film 3, and an etching stopper film 1 was formed on the under the organic insulating film 4.

The structure shown in FIG. 18 is the same as that of FIG. 1 except that the third hard mask 7 is omitted. Although not shown in FIG. 18, an interlayer insulating film having the same configuration as that of FIG. 1 was interposed between the etching stopper film 1 and the semiconductor substrate 20.

The first organic insulating film 2 and the second organic insulating film 3 were formed through the deposition of SiOC and PAE, respectively, by a PE-CVD method. By using the same procedures as illustrated in Embodiment 1, the first hard mask 5 formed of a silane type $SiO_2$ film and the second hard mask 6 formed of an SiN film were deposited on the organic insulating film 4 which was constructed as described above. In this embodiment, the film thickness of each of these first and second hard masks 5 and 6 was set to 145 nm and 100 nm, respectively.

A resist pattern (not shown) was formed on the second hard mask 6, and then the second hard mask 6 was subjected to dry etching by using a gas comprising $CHF_3/Ar/O_2$ to form a recess or a pattern of wiring trenches 8a and 8b as shown in FIG. 18. The width of each of these wiring trenches 8a and 8b was 3 μm and 0.4 μm, respectively.

Figure 19:
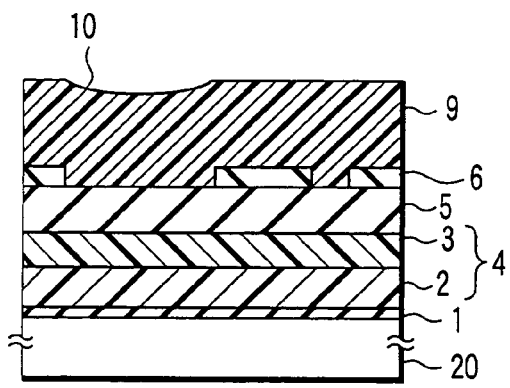
FIG. 19 is a cross-sectional view illustrating a step following the step illustrated in FIG. 18.

On the second hard mask 6 provided with these wiring trenches 8a and 8b, a first organic film 9 was formed as shown in FIG. 19. This first organic film 9 was formed in such a manner that a resist (IX370G available from JSR Co., Ltd.) mainly comprising novolak resin was coated over the second hard mask 6 to form a coated film having a thickness of 0.3 μm, which was then subjected to prebaking for 60 seconds at a temperature of 180° C. and then to post-baking for 60 seconds at a temperature of 300° C. to obtain a first organic film 9. This first organic film 9 contacts, at the bottom thereof, with the first hard mask 5 formed of silane-type $SiO_2$. Since the adhesion between the novolak resin and $SiO_2$ film is better than the adhesion between the novolak resin and SiN, it would be possible to further enhance the adhesion of the organic film as compared with the case of the triple hard mask method.

As shown in FIG. 19, the surface of the first organic film 9 was accompanied with a step portion 10 which reflecting the pattern of the wiring trench 8a. In this embodiment, this step portion 10 was planarized by CMP, which was followed by the re-deposition of the organic film to form an underlying layer, thus suppressing the focus error.

By using EPO-222 (a CMP apparatus, available from Ibara Seisakusho Co., Ltd.), the polishing of the first organic film 9 was performed. Namely, while rotating a turntable having a polishing pad attached thereto at a speed of 100 rpm, a top ring holding a semiconductor wafer was allowed to contact with the polishing pad at a polishing load of 100 gf/cm². As for the polishing pad, IC1000/Suba4000 (trademark; RODEL NITTA Co., Ltd.) was employed, and the rotational speed of the top ring was set to 101 rpm. The polishing was performed for 60 seconds while feeding a slurry over the polishing pad at a flow rate of 200 cc/min. The slurry was prepared by dispersing γ-alumina (primary particle having a particle diameter of about 30 nm) as abrasive particles in pure water at a concentration of 1 wt %.

Figure 20:
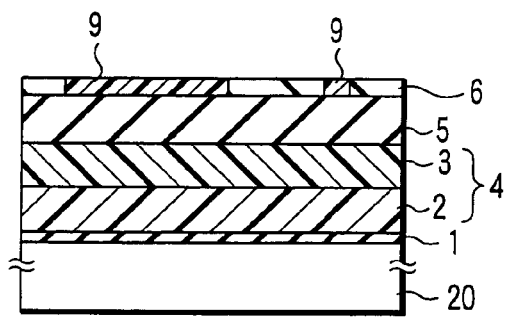
FIG. 20 is a cross-sectional view illustrating a step following the step illustrated in FIG. 19.

As a result, as shown in FIG. 20, the surface of the second hard mask 6 was exposed, and the first organic film 9 was selectively buried in the pattern of wiring trenches 8a and 8b.

Further, it was possible to restrict the dishing on the surface of the first organic film 9 to not more than 10 nm in depth after the aforementioned polishing.

Figure 21:
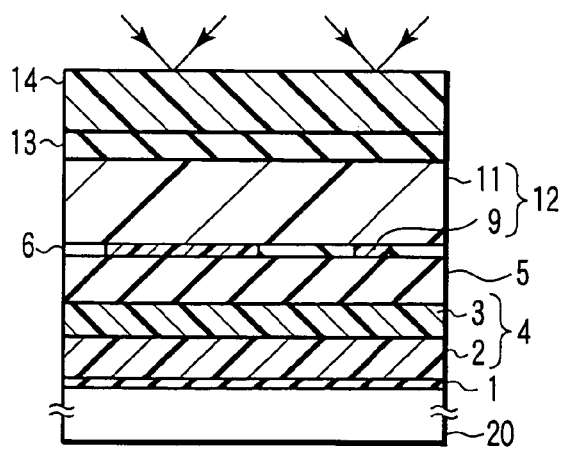
FIG. 21 is a cross-sectional view illustrating a step following the step illustrated in FIG. 20.

Further, the IX370G was again coated to form a second organic film 11 to obtain an underlying layer 12 comprising the first organic film 9 and the second organic film 11. Thereafter, as shown in FIG. 21, an SOG (Spin On Glass) film as an intermediate layer 13 and a resist film 14 were successively formed. In this embodiment, the second organic film 11 was deposited to a thickness of 300 nm. On the other hand, the thickness of each of the intermediate layer 13 and the resist film 14 was set to 45 nm and 200 nm, respectively.

Figure 22:
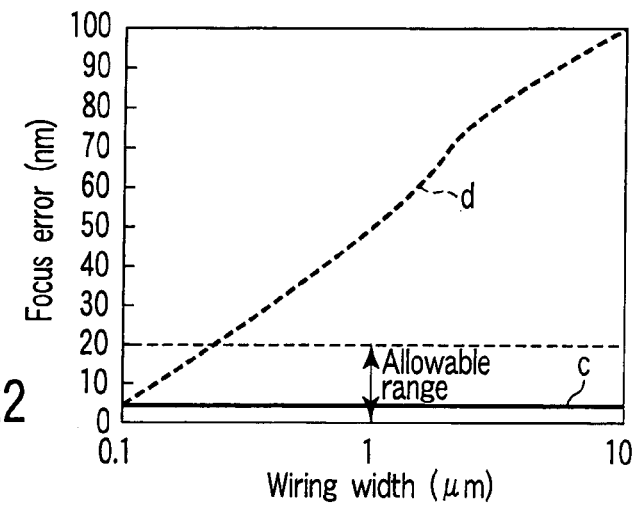
FIG. 22 is a graph illustrating the relationship between the width of wiring and the focus error.

Subsequently, through an exposure mask having a predetermined pattern of holes, the resist film 14 was subjected to the exposure using a KrF excimer laser. On this occasion, due to the planarizing by the CMP, the focus error in the formation of via-holes on the wirings having a width of 3 μm or 0.4 μm was limited to 10 nm or less. The graph of FIG. 22 illustrates the relationship between the width of wiring and the focus error. The results obtained in this embodiment are illustrated by a solid line "c" indicating that the focus error was substantially constant irrespective of the width of wiring. It will be seen from these results that non-uniformity in pattern dimensions can be suppressed and hence the yield of product can be remarkably enhanced. Incidentally, the dashed line "d" in FIG. 22 illustrates a case where the exposure was performed on a resist film which was formed according to the conventional method, which will be explained hereinafter.

Figure 23:
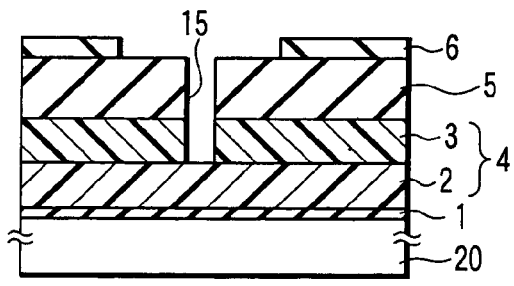
FIG. 23 is a cross-sectional view illustrating a step following the step illustrated in FIG. 21.

In the same manner as illustrated in Embodiment 1, the intermediate layer 13 and the underlying layer 12 were patterned, and the resist pattern was removed. By using the patterned intermediate layer 13 and the underlying layer 12 as a mask, an interconnecting hole was formed to pierce through the first hard mask 5 by dry etching. As for the etching gas, a gas comprising $CHF_3/Ar/O_2$ was employed. Incidentally, when working the first hard mask 5, the intermediate layer was removed. Thereafter, dry etching was performed using $NH_3$ gas to form an interconnecting hole 15 in the second organic insulating film 3 as shown in FIG. 23. Incidentally, the underlying layer 12 was removed when working the second organic insulating film 3.

Figure 24:
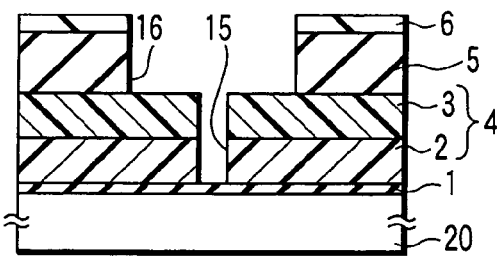
FIG. 24 is a cross-sectional view illustrating a step following the step illustrated in FIG. 23.
Figure 25:
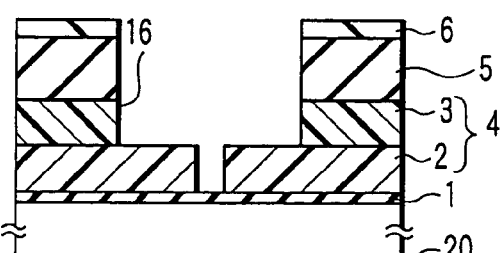
FIG. 25 is a cross-sectional view illustrating a step following the step illustrated in FIG. 24.

Then, by using a gas comprising $C_5F_8/Ar/O_2$, dry etching was performed to form wiring trenches 16 in the first hard mask 5 as shown in FIG. 24. In this case, the interconnecting hole 15 was formed in the first organic insulating film 2 so as to reach the etching stopper film 1. By contrast to the triple hard mask method, it is possible, according to this dual hard mask method, to form the interconnecting hole 15 so as pierce the first organic insulating film 2 by using a single working step. Then, dry etching using $NH_3$ gas, a wiring trench 16 was formed in the second organic insulating film 3 as shown in FIG. 25.

Figure 26:
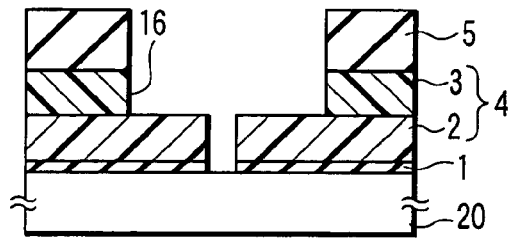
FIG. 26 is a cross-sectional view illustrating a step following the step illustrated in FIG. 25.

Finally, by using a gas comprising $CH_2F_2/CF_4/Ar/O_2$, the second hard mask 6 was removed as shown in FIG. 26. On this occasion, the etching stopper film 1 existing on the bottom of the interconnecting hole 15 was also removed.

Subsequently, a barrier layer (not shown) was formed on the inner wall of the recesses such as the interconnecting hole 15 and the wiring trench 16. Then, these recesses were filled with a Cu film, and redundant portions of the Cu film and of the barrier layer existing on the silicon oxide film employed as the first hard mask 5 were removed. As a result, it was possible to form a Cu damascene wiring in these recesses, thus forming a hybrid dual damascene wiring.

In this embodiment, the first organic film 9 was planarized by CMP prior to the formation of a multi-layer by additionally depositing a resist film above the first organic film 9. Accordingly, it was possible to limit the focus error to 10 nm or less during the step of exposure, thereby suppressing the non-uniformity in pattern dimension and hence remarkably enhancing the yield of product.

Figure 27:
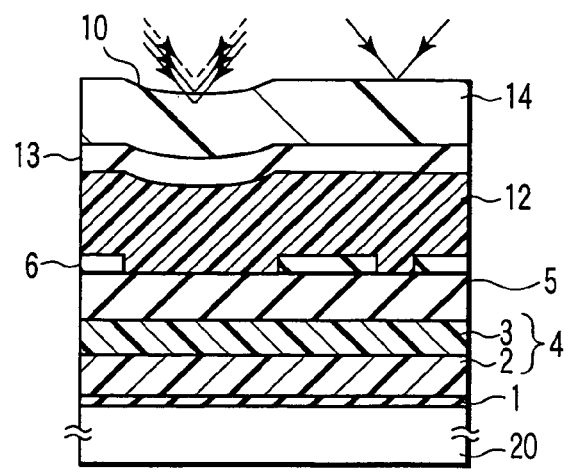
FIG. 27 is a cross-sectional view illustrating the method of manufacturing a semiconductor device according to the conventional method.

For the purpose of comparison, formation of a hybrid dual damascene wiring was tried by the conventional method. First of all, after finishing the fabrication of the structure shown in FIG. 18 the same method as described above, the underlying layer 12, the intermediate layer 13 formed of SOG, and the resist film 14 were successively formed on the second hard mask 6 as shown in FIG. 27. According to the conventional dual hard mask method, in order to secure a sufficient etching selectivity ratio between an upper hard mask and a lower hard mask, the film thickness of the upper hard mask is formed to have a relatively large thickness. In this example, the film thickness of the second hard mask 6 was set to 100 nm. When the film thickness of the second hard mask 6 is enlarged to such a degree, the large focus error would be generated in the step of lithography for forming a pattern of holes.

The second hard mask 6 was provided with a pattern of wiring trenches 8a having a width of 3 μm and with a pattern of wiring trenches 8b having a width of 0.4 μm. In this case, the underlying layer 12 having the step portion 10 was used as it is.

As shown in FIG. 27, the film thickness of the underlying layer 12 existing over the pattern of wiring trenches 8a having a width of 3 μm was smaller than that of the underlying layer 12 existing over the pattern of wiring trenches 8b having a width of 0.4 μm, the difference in film thickness between them being about 80 nm. This magnitude of difference in film thickness would inevitably lead to a generation of focus error, thus resulting in an increase of non-uniformity in pattern dimensions and hence the deterioration of the product yield.

Subsequently, by using a predetermined exposure mask, the exposure of the resist film 14 was performed by a KrF excimer laser. The relationship between the width of wiring and the focus error on this occasion is shown as a dashed line "d" in FIG. 22. The focus error in forming the via-hole between the wiring having a line width of 3 μm and the wiring having a line width of 0.4 μm was as large as 80 nm.

The dual hard mask method is advantageous in terms of the manufacturing cost and productivity as the number of manufacturing steps can be reduced as compared with the triple hard mask method. Moreover, according to the dual hard mask method, it is possible to realize an increased adhesion between the organic film and the hard mask. However, due to an increased magnitude of the step portion of the hard mask, the focus error in the step of forming via-holes is inevitably increase in the case of the dual hard mask method. Due to this problem, the triple hard mask method has been frequently adopted. However, when the dual hard mask method according to this embodiment which is featured to include a step of planarizing the underlying layer is adopted, it is possible to reduce the number of manufacturing steps and at the same time, to decrease the focus error. Namely, the dual hard mask method according to this embodiment is better the conventional triple hard mask method and the conventional dual hard mask method, both conventional methods failing to include a step of planarizing the underlying layer.

Embodiment 7

This embodiment illustrates a case where a pattern of holes was formed by lithography using and ArF excimer laser, which was capable of forming a further fine pattern.

As already explained with reference to Embodiment 2, in the case where an ArF excimer laser is desired to be employed as a light source for the exposure, an organic film mainly comprising cyclohexanone is required to be employed as an underlying layer. Therefore, the fabrication of a hybrid dual damascene wiring was tried by following the same procedure as explained in Embodiment 6 except that a resist mainly comprising cyclohexanone (CT01, JSR Co., Ltd.) was employed as the second organic film.

In this case also, due to the planarizing by CMP, the focus error was limited to 10 nm or less, and hence it was possible to suppress the non-uniformity in pattern dimension and to remarkably enhance the yield of product.

Even in this embodiment, as illustrated by a solid line "a" in FIG. 22, the focus error was substantially constant irrespective of the width of wiring.

Even in the dual hard mask method, the first organic film can be formed by applying the same conditions as in the case of the triple hard mask method, and the CMP can be performed under the same conditions as in the case of the triple hard mask method, thus planarizing the first organic film. Further, various procedures such as the formation of thicker second hard mask, the formation of a thinner organic film, the EB curing, etc. can be singly employed or suitably combined with each other so as to enhance the adhesion of the organic film and to prevent the peeling of the organic film. As in the case of the triple hard mask method, this dual hard mask method is also capable of minimizing the focus error while enabling to increase the adhesion between the first organic film and the hard mask.

Embodiment 8

As described above, in order to effectively suppress the peeling of an underlying layer in the step of CMP of the organic film, it is more desirable to increase the thickness of hard mask.

However, in the employment of dual hard mask method, the following problems would be encountered if the thickness of SiN film constituting a second hard mask is to be increased. Namely, as explained above with reference to FIGS. 25 and 26, when removing the etching stopper film 1, it is required that the second hard mask 6 is concurrently removed. On the other hand, with a view to minimize the dielectric constant, there is an increasing trend to decrease the thickness of the etching stopper film 1. Therefore, if the film thickness of the second hard mask 6 is set to 150 nm or more and the film thickness of the etching stopper film 1 is set to less than 35 nm, there are much possibilities that the second hard mask 6 may remain after removing the etching stopper film 1. Since SiN to be employed as a material for the second hard mask 6 increases interwiring capacitance, SiN is required to be removed as completely as possible. It may be conceivable to employ a method wherein the second hard mask 6 is removed when Cu-CMP which will be performed in a subsequent step. However, it is generally difficult to employ such a method in viewpoints of polishing speed and etching selective ratio.

In view of these problems, according to this embodiment, the second hard mask 6 relatively large in thickness was worked in advance to form a pattern of wiring trench and then a first organic film was formed thereon. After the first organic film was planarized by CMP, the resultant planarized surface was subjected to dry etching to perform the etch-back of these layers, thus thinning both the second hard mask and the first organic film. The procedures subsequent to this step were performed according to the method of this embodiment as explained hereinafter with reference to FIGS. 28 to 31.

Figure 28:
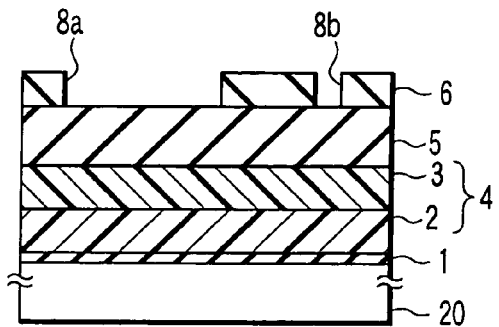
FIG. 28 is a cross-sectional view illustrating the method of manufacturing a semiconductor device according to another embodiment of the present invention.

First of all, as shown in FIG. 28, an organic insulating film 4, a first hard mask 5 containing an inorganic material, and a second hard mask 6 containing an inorganic material were successively formed on a semiconductor substrate 20 having semiconductor elements (not shown) formed therein. Then, patterns of wiring trenches 8a and 8b as recesses were formed in the second hard mask 6. In this embodiment shown in the drawings, the organic insulating film 4 was constituted by a 2-ply structure containing a first organic insulating film 2 and a second organic insulating film 3. The etching stopper film 1 was formed below the organic insulating film 4.

The structure shown in FIG. 28 was essentially the same as that of FIG. 18 except that the film thickness of the second hard mask 6 was made thicker than 100 nm and the film thickness of the etching stopper film 1 was made less than 35 nm. As for the first organic insulating film 2 and the second organic insulating film 3 in this embodiment, BD2 and SILK were employed, respectively, and deposited by CVD and coating, respectively. On this organic insulating film 4 formed in this manner, a first hard mask 5 made of silane-based $SiO_2$ and a second hard mask 6 made of SiN were successively deposited. The film thickness of these first and second hard masks 5 and 6 was set to 160 nm and 150 nm, respectively. Further, in the manner as in Embodiment 6, the second hard mask 6 was worked to form wiring trench patterns 8a and 8b as shown in FIG. 28. The width of these wiring trench patterns 8a and 8b was set to 3 µm and 0.4 µm, respectively.

Figure 29:
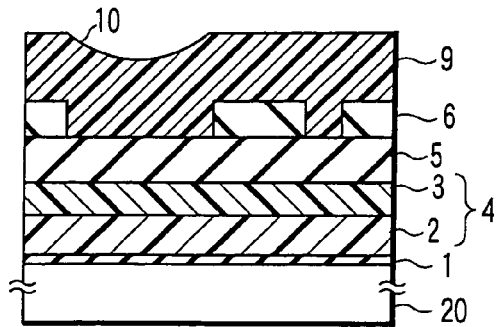
FIG. 29 is a cross-sectional view illustrating a step following the step illustrated in FIG. 28.

Then, as shown in FIG. 29, a first organic film 9 was formed on the second hard mask 6 having these wiring trench patterns 8a and 8b formed therein. Specifically, the first organic film 9 was formed in such a manner that the same kind of resist (IX870, available from JSR) consisting mainly of novolac resin as described above was coated on the second hard mask 6, prebaked for 60 seconds at a temperature of 180° C., and post-baked for 60 seconds at a temperature of 300° C., thereby obtaining the first organic film 9.

Figure 30:
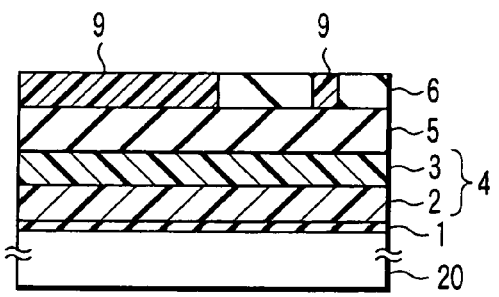
FIG. 30 is a cross-sectional view illustrating a step following the step illustrated in FIG. 29.

As shown in FIG. 29, on the surface of the first organic film 9, a step portion 10 was generated, reflecting the wiring trench pattern 8a. In this embodiment, first of all, this step portion 10 was planarized by CMP. It was possible to perform the CMP of the first organic film 9 by using the same apparatus as employed in Embodiment 6 and under the same conditions as in Embodiment 6. When the polishing was continued for 50 seconds, the surface of the second hard mask 6 was exposed as shown in FIG. 30, leaving the first organic film 9 inside the wiring trench patterns 8a and 8b. Further, the generation of dishing was suppressed to 20 nm or less.

Figure 31:
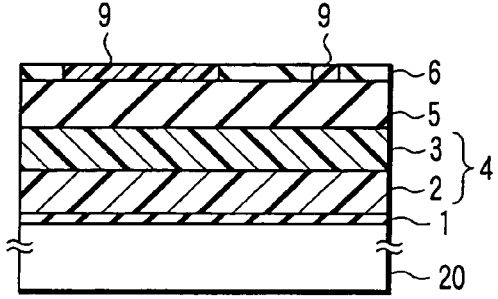
FIG. 31 is a cross-sectional view illustrating a step following the step illustrated in FIG. 30.

Then, the second hard mask 6 and the first organic film 9 were subjected to etching to perform the etch-back of them until the film thickness thereof was reduced to 50 nm or less as shown in FIG. 31. More specifically, by using $CF_4+O_2$-based gas, the RIE of these second hard mask 6 and first organic film 9 was performed under the conditions wherein the selective etching ratio between them would become 1/1. The flow rate of each of the gases was set to such that about 1 to 500 sccm for $CF_4$ and about 1 to 500 sccm for $O_2$.

By performing the RIE under these conditions, it was possible to sufficiently reduce the thickness of the second hard mask 6 while maintaining the planarity of the etched surface. Therefore, it was possible to overcome the problem that the second hard mask 6 remains after removing the etching stopper film 1. Further, since these second hard mask 6 and first organic film 9 were subjected to etch-back by RIE, it was possible to remove the etching residue of the organic film in the dry etching. Therefore, when coating of a second organic film which will be subsequently performed, it would be possible to avoid the generation of cracks of the coated film that may occur due to the etching residue.

According to the same process as described in Embodiment 6, a second organic film, an intermediate film and a resist film were successively formed on the second hard mask 6 that had been reduced in thickness, and then subjected to a patterning exposure as shown in FIG. 21. Since the planarity of the resist film was secured in this embodiment also in the same manner as in the case of Embodiment 6, the focus error was maintained almost constant irrespective of the width of wiring. As a result, it was possible to suppress the variability in dimension of the patterns and to considerably enhance the yield of products. It was possible, in this manner, to considerably increase the exposure tolerance in the lithography of via-hole.

Thereafter, in the same manner as in the case of Embodiment 6 and as shown in FIGS. 23 to 26, the interconnecting hole (via-hole) and the wiring trench were worked to form a recess. Since the film thickness of the second hard mask was confined to 50 nm or less, it was possible to remove the second hard mask when opening the via-hole for communicating with the etching stopper film 1 as shown in FIG. 26. Finally, the recess was filled, via a barrier layer, with a Cu layer, thereby fabricating a hybrid dual damascene wiring.

In this embodiment, it was possible to maintain the planarity of the resist film while suppressing the peeling of the first organic film as well as the generation of etching residue of the organic film. Moreover, since the second hard mask was reliably removed when removing the etching stopper film, it was possible to avoid any increase of the interwiring capacitance.

Embodiment 9

This embodiment will be explained with reference to FIGS. 32 to 34.

The method of manufacturing a semiconductor device according to this embodiment comprises forming an organic insulating film containing an organic material above a substrate; forming at least a lower hard mask and an upper hard mask, each containing an inorganic material, successively above the organic insulating film; forming a recess in the upper hard mask; successively forming an underlying layer, an intermediate layer and a resist film above the upper hard mask having the recess formed therein, the intermediate layer being planarized by chemically mechanically polishing using a slurry prior to forming the resist film; and subjecting the resist film to patterning exposure.

First of all, in the same manner as in the case of Embodiment 1, an etching stopper film 1, an organic insulating film 4, a first hard mask 5, a second hard mask 6 and a third hard mask 7 were successively deposited on the semiconductor substrate 20. Then, the third hard mask 7 was worked to form wiring trench patterns 8a and 8b as shown in FIG. 1.

All of these films were formed using the same materials as described in Embodiment 1, the film thickness thereof being also the same as described in Embodiment 1, and the width of these wiring trench patterns 8a and 8b was set to the same as in Embodiment 1, i.e. 3 µm and 0.4 µm, respectively.

Figure 32:
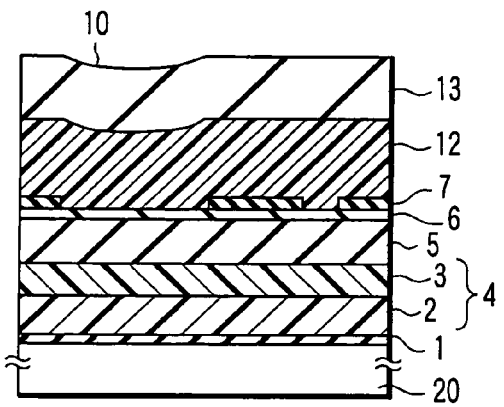
FIG. 32 is a cross-sectional view illustrating the method of manufacturing a semiconductor device according to another embodiment of the present invention.

As shown in FIG. 32, an underlying film 12 and an intermediate layer 13 were successively formed on the third hard mask 7 having the wiring trench patterns 8a and 8b formed therein. More specifically, the underlying film 12 was formed by coating method to a thickness of 300 nm and the intermediate layer 13 was constituted by an SOG film having a thickness of 210 nm. The underlying film 12 in this embodiment corresponds to the first organic film 9 having a step portion on its surface as shown in FIG. 2.

As shown in FIG. 32, a step portion 10 reflecting the wiring trench pattern 8a was generated on the surface of the intermediate layer 13, the depth of the step portion 10 being about 50 nm. In this embodiment, this step portion 10 was planarized by CMP and then a resist film was formed, thereby suppressing the focus error.

By using EPO-222 (EBARA CORPORATION Ltd.) as a CMP apparatus, the polishing of the intermediate layer 13 was performed. Namely, while rotating a turntable having a polishing pad attached thereto at a speed of 100 rpm, a top ring holding a semiconductor wafer was allowed to contact with the polishing pad at a polishing load of 400 gf/cm$^2$. As for the polishing pad, IC1000/Suba4000 (trademark; RODEL NITTA Co., Ltd.) was employed, and the rotational speed of the top ring was set to 100 rpm. The intermediate layer 13 was polished while feeding a slurry over the polishing pad at a flow rate of 200 cc/min.

The slurry was prepared in such a manner that cerium oxide particles (about 50 nm in primary particle diameter) was employed as abrasive particles and dispersed in pure water at a concentration of 0.45 wt % to obtain a dispersion, to which polyacrylic acid was added as a surfactant at a concentration of 3 wt %, thereby obtaining the slurry. As for the cerium oxide, it is possible to employ, for example, CMS4301 (available from JSR) and as for the surfactant, it is possible to employ, for example, CMS4302 (available from JSR). As for the surfactant, it is also possible to employ a cationic or nonionic surfactant or a polymeric surfactant.

Figure 33:
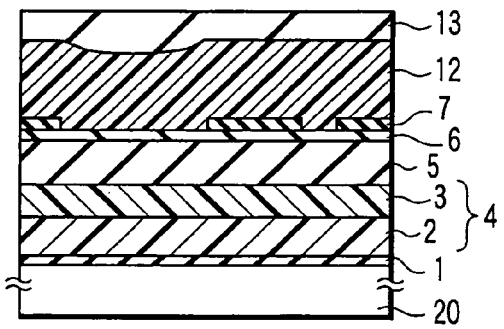
FIG. 33 is a cross-sectional view illustrating a step following the step illustrated in FIG. 32.
Figure 34:
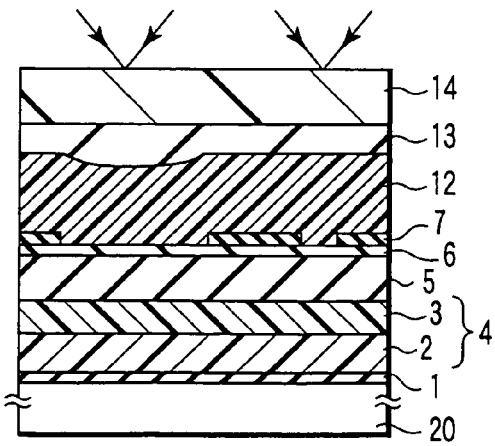
FIG. 34 is a cross-sectional view illustrating a step following the step illustrated in FIG. 33.

As a result of the polishing of the intermediate layer 13 for a period of 80 seconds, the thickness of the intermediate layer 13 was reduced by a thickness of 100 nm and the step portion 10 was reduced to 20 nm or less in height as shown in FIG. 33. Thereafter, a resist film 14 having a thickness of 200 nm was deposited on the planarized intermediate layer 13 as shown in FIG. 34 and then subjected to exposure using ArF excimer laser through an exposure mask having a pattern of holes each having a diameter of 90 nm as shown in FIG. 34. On this occasion, due to the planarization by the CMP, the focus error in the formation of via-holes between the wiring having a line width of 3 μm and the wiring having a line width of 0.4 μm was suppressed to 10 nm or less.

In the method of this embodiment, since the layer to be planarized is the intermediate layer 13 made of an SOG film, the control of residual film in the planarization of this intermediate film 13 is easier as compared with that in the planarization of an organic film. Therefore, it is possible to secure a pre-set film thickness and planarity of the intermediate film 13 as long as the polishing of the intermediate film 13 is performed under predetermined conditions, thus no longer necessitating the repetition of coating of SOG film. Accordingly, it is now possible to reduce the process cost and improve the throughput.

The method of this embodiment is also applicable to the dual hard mask method explained in the aforementioned Embodiment 6. In that case, the first organic film 9 formed as shown in FIG. 19 can be employed as the underlying film 12, on which the intermediate layer 13 can be formed. Namely, even in the case of the dual hard mask method wherein a 2-ply structure consisting of a lower hard mask (a first hard mask 5) and an upper hard mask (a second hard mask 6) is employed as a hard mask, it is possible to obtain the same effects as obtainable in the triple hard mask method wherein a 3-ply structure consisting of a lower hard mask (a first hard mask 5), an intermediate hard mask (a second hard mask 6) and an upper hard mask (a third hard mask 7) is employed as a hard mask.

According to the embodiments of the present invention, it is now possible to provide a method of manufacturing a semiconductor device, which is capable of suppressing the non-uniformity in dimension of patterns and also capable of forming a dual damascene wiring with high yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
    forming an insulating film above a substrate;
    forming a recess in the insulating film;
    successively forming an underlying layer, an intermediate layer, and a resist film above the insulating film having the recess formed thereon, the underlying layer being formed by a process comprising:
        forming a first organic film above the insulating film, the first organic film comprising a novolac resin and being subjected, in formation thereof, to a baking of not lower than a crosslinking-finishing temperature thereof;
        chemically mechanically polishing the first organic film to expose a surface of the insulating film and to remain the first organic film selectively in the recess, the polishing being performed using a slurry containing γ-alumina as abrasive particles; and
        forming a second organic film above the insulating film and above the first organic film; and
    subjecting the resist film to patterning exposure.

2. The method according to claim 1, wherein the insulating film comprises an organic insulating film containing an organic material and an inorganic insulating film containing an inorganic material formed above the organic insulating film.

3. The method according to claim 2, wherein the inorganic insulating film comprises at least a lower hard mask and an upper hard mask.

4. A method of manufacturing a semiconductor device comprising:
    forming an organic insulating film containing an organic material above a substrate;
    forming a first hard mask, a second hard mask and a third hard mask each containing an inorganic material above the organic insulating film;
    forming a recess in the third hard mask;
    successively forming an underlying layer, an intermediate layer, and a resist film above the third hard mask having the recess formed thereon, the underlying layer being formed by a process comprising:
        forming a first organic film above the third hard mask, the first organic film comprising a novolac resin and being subjected, in formation thereof, to a baking of not lower than a crosslinking-finishing temperature thereof;
        chemically mechanically polishing the first organic film to expose a surface of the third hard mask and to remain the first organic film selectively in the recess, the polishing being performed using a slurry containing γ-alumina as abrasive particles; and
        forming a second organic film above the third hard mask and above the first organic film; and subjecting the resist film to patterning exposure.

5. The method according to claim 4, wherein the abrasive particles have a hydrophilic surface.

6. The method according to claim 4, wherein the baking of the first organic film is performed at a temperature of 300° C. or more.

7. The method according to claim 6, wherein the first organic film is subjected to the baking so as to have an average hardness of greater than 0.45 GPa.

8. The method according to claim 4, wherein the second organic film mainly comprises a novolak resin, and the patterning exposure is performed using a KrF excimer laser.

9. The method according to claim 4, wherein the second organic film mainly comprises cyclohexanone, and the patterning exposure is performed using an ArF excimer laser.

10. The method according to claim 4, wherein the third hard mask has a film thickness ranging from 50 nm to 200 nm.

11. The method according to claim 4, wherein the first organic film has a film thickness ranging from a total thickness of the film thickness of the third hard mask+50 nm to a total thickness of the film thickness of the third hard mask+100 nm.

12. A method of manufacturing a semiconductor device comprising:
    forming an organic insulating film containing an organic material above a substrate;
    forming a first hard mask and a second hard mask each containing an inorganic material above the organic insulating film;
    forming a recess in the second hard mask;
    successively forming an underlying layer, an intermediate layer, and a resist film above the second hard mask having the recess formed thereon, the underlying layer being formed by a process comprising:
       forming a first organic film above the second hard mask, the first organic film comprising novolac resin and being subjected, in formation thereof, to a baking of not lower than a crosslinking-finishing temperature thereof;
       chemically mechanically polishing the first organic film to expose a surface of the second hard mask and to remain the first organic film selectively in the recess, the polishing being performed using a slurry containing γ-alumina as abrasive particles; and
       forming a second organic film above the second hard mask and above the first organic film; and
    subjecting the resist film to patterning exposure.

13. The method according to claim 12, wherein the abrasive particles have a hydrophilic surface.

14. The method according to claim 12, wherein the baking of the first organic film is performed at a temperature of 300° C. or more.

15. The method according to claim 14, wherein the first organic film is subjected to the baking so as to have an average hardness of greater than 0.45 GPa.

16. The method according to claim 12, wherein the second organic film mainly comprises a novolak resin, and the patterning exposure is performed using a KrF excimer laser.

17. The method according to claim 12, wherein the second organic film mainly comprises cyclohexanone, and the patterning exposure is performed using an ArF excimer laser.

18. The method according to claim 12, wherein the second hard mask has a film thickness ranging from 50 nm to 200 nm.

19. The method according to claim 18, further comprising performing an etch-back by dry etching the first organic film and the second hard mask before forming the second organic film above the first organic film and the second hard mask.

20. The method according to claim 12, wherein the first organic film has a film thickness ranging from a total thickness of the film thickness of the second hard mask+50 nm to a total thickness of the film thickness of the second hard mask+100 nm.

* * * * *